United States Patent [19]

Tseng

[11] Patent Number: 5,728,614
[45] Date of Patent: Mar. 17, 1998

[54] METHOD TO IMPROVE THE TOPOGRAPHY OF A FIELD OXIDE REGION

[75] Inventor: Horng-Huei Tseng, Hsinchu, Taiwan

[73] Assignee: Vanguard International Semiconductor Corporation, Hsin-chu, Taiwan

[21] Appl. No.: 719,345

[22] Filed: Sep. 25, 1996

[51] Int. Cl.[6] .................................. H01L 21/8238
[52] U.S. Cl. ........................ 438/225; 438/294; 438/439
[58] Field of Search ................................ 438/439, 443, 438/225, 303, 294–297

[56] References Cited

U.S. PATENT DOCUMENTS

| | | | |
|---|---|---|---|
| 4,333,964 | 6/1982 | Ghezzo | 427/93 |
| 4,374,698 | 2/1983 | Sanders et al. | 156/643 |
| 5,374,585 | 12/1994 | Smith et al. | 437/69 |
| 5,376,230 | 12/1994 | Ito | 156/657 |
| 5,399,520 | 3/1995 | Jang | 437/67 |
| 5,403,770 | 4/1995 | Jang | 437/69 |
| 5,472,905 | 12/1995 | Paek et al. | 437/70 |

*Primary Examiner*—Jey Tsai
*Assistant Examiner*—Joni Y. Chang
*Attorney, Agent, or Firm*—George O. Saile; Stephen B. Ackerman

[57] ABSTRACT

A process for reducing the severe topography in field oxide regions, via use of insulator spacers, on the sides of the field oxide region, has been developed. An insulator layer is first deposited on a field oxide region, and on the active device region, between the isolating field oxide regions. An anisotropic RIE procedure is next employed to create insulator spacers, on the sides of the field oxide regions. The insulator spacers reduce the severity of the field oxide regions, reducing the risk of polysilicon residuals and unwanted sidewalls, during the patterning process used to create the polysilicon gate structure.

22 Claims, 4 Drawing Sheets

METHOD TO IMPROVE THE TOPOGRAPHY OF A FIELD OXIDE REGION

BACKGROUND OF THE INVENTION (1) Field of the Invention

The present invention relates to a method used to fabricate a metal oxide semiconductor field effect transistor, (MOSFET), device, and more specifically to a process used to improve the topography of the field oxide regions, used for device isolation.

(2) Description of Prior Art

The semiconductor industry is continually striving to increase device performance, while still maintaining, or decreasing the cost of these same semiconductor devices. The ability to create MOSFET devices with sub-micron features have allowed both the performance and cost objectives to be successfully addressed. Devices with sub-micron features result in decreases in performance degrading, parasitic capacitances, as well as decreases in performance degrading, resistances. In addition sub-micron features allow the same level of integration to be realized for smaller semiconductor chips, thus allowing more chips to be obtained from a specific size starting semiconductor substrate, and thus reducing the processing cost of a specific chip. Several semiconductor fabrication disciplines, such as photolithography and dry etching, have contributed to the attainment of sub-micron devices. More sophisticated exposure tools, as well as the use of more sensitive photoresist materials, have allowed sub-micron images, in photoresist layers, to be routinely achieved. In addition similar breakthroughs in dry etching tools have allowed the sub-micron images in photoresist layers to be successfully transferred to underlying materials, used in the fabrication of sub-micron device.

However as specific device features decrease in size, new concerns arise. Insulator regions, used for purposes of isolating devices or cells, are usually produced via a process known as LOCOS, (LOCal Oxidation of Silicon). These insulator regions, usually referred to as FOX, (field oxide), regions, are created via thermal oxidation of the semiconductor substrate, with subsequent areas of the semiconductor substrate protected from the FOX oxidation process by a oxidation resistant, composite masking layer. The patterned oxidation resistant, composite masking layer is usually comprised of an overlying layer of oxidation resistant, silicon nitride, and an underlying layer of silicon oxide, present to buffer the stress of the overlying silicon nitride layer. A feature of FOX regions, produced via thermal oxidation, and patterned via composite oxidation resistant masking, is that approximately one half of the thermally grown FOX, resides above the original semiconductor surface, with the other half of the FOX, below the original semiconductor surface. In addition the FOX region presents a severe slope, traversing from the top of the FOX region to the surface of the semiconductor substrate. This topographical configuration can adversely effect the conformality of subsequent overlying layers, such as polysilicon, or metal. In addition another unwanted feature, referred to as birds beak formation, can also adversely influence topography. Birds beak is a result of unwanted oxide formation, at the periphery of, and under, the oxidation resistant, composite mask. These unwanted FOX features, adversely influencing topography, can even be more acute, when using submicron features. The close proximity of isolation, or FOX regions, with demanding topography, and severe slopes, result in difficulties when fabricating active device regions in the spaces between FOX regions. For example the patterning of polysilicon, to create a polysilicon gate structure, can result in unremoved polysilicon residuals, in areas in which the polysilicon layer traversed severe FOX topography.

Prior art has addressed the topography of FOX layers, such as Smith, et al, in U.S. Pat. No. 5,374,585, and Paek, et al, in U.S. Pat. No. 5,472,905. These inventions use a planarization process of the FOX region to improve topography. However the topography resulting from the birds beak formation still exists. This invention will teach a process in which an insulator spacer is formed, after creation of the FOX regions. The insulator spacer reduces the severity of the slope of the FOX region, due to both birds beak formation, and FOX growth above and below the semiconductor substrate. The gentler slope allows subsequent layers to be more conformally deposited.

SUMMARY OF THE INVENTION

It is an object of this invention to fabricate a MOSFET device structure using field oxide, (FOX), regions for isolation.

It is another object of this invention to reduce the severity of the FOX topography, by creating insulator spacers on the sides of FOX regions, via deposition of, and dry etching of, an insulator layer.

In accordance with the present invention a method of improving the topography of a FOX oxide region, used in a MOSFET device structure, via the formation of insulator spacers on the sides of the FOX region, is described. For purposes of device isolation, a FOX region is formed, in a semiconductor substrate, via thermal oxidation procedures. A silicon nitride - silicon oxide composite mask, is used to prevent oxidation in areas of the semiconductor substrate, to be used for subsequent active device regions. After removal of the silicon nitride - silicon oxide composite mask, an insulator layer is chemically vapor deposited, followed by a blanket, anisotropic reactive ion etching procedure, creating insulator spacers on the sides of the FOX isolation regions, and reducing the severity of the slope of the FOX region. Conventional MOSFET processing is then performed, comprising the growth of a gate insulator layer, and the conformal deposition of a polysilicon layer. Patterning of the conformal polysilicon layer via photolithographic and reactive ion etching procedures, are used to create a polysilicon gate structure. Lightly doped source and drain processing, insulator spacer formation, on the sides of the polysilicon gate structure, and heavily doped source and drain processing, are next performed, followed by the creation of metal contacts, to active device regions, completing the fabrication sequence for the MOSFET device structure.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

Figure 1:
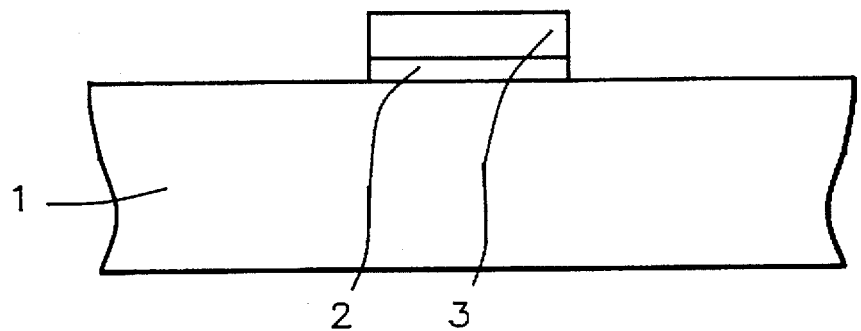
FIGS. 1-3, which schematically, in cross-sectional style, illustrate the formation of the FOX region.

A method of fabricating a MOSFET device, using insulator spacers on the sides of FOX regions, for improved MOSFET topography, will now be covered in detail. A P type, single crystalline, silicon substrate, 1, with a <100> crystallographic orientation, is used. The formation of a oxidation resistant, composite mask, is next addressed. A layer of silicon dioxide, 2, is thermally grown in an oxygen steam ambient, at a temperature between about 850° to 1000° C., to a thickness between about 100 to 500 Angstroms. Next a layer of silicon nitride, 3, is deposited using low pressure chemical vapor deposition, (LPCVD), procedures, at a temperature between about 600° to 800° C., to a thickness between about 500 to 1500 Angstroms. Conventional photolithographic and reactive ion etching, (RIE), procedures, using $Cl_2$ as an etchant for silicon nitride layer, 3, and $CHF_3$ as an etchant for silicon dioxide layer, 2, are used to create the oxidation resistant, composite mask of silicon nitride, 3 - silicon dioxide, 2, schematically shown in FIG. 1. Photoresist removal is performed using plasma oxygen ashing. The oxidation resistant, composite mask will prevent subsequent FOX regions from forming in areas of the MOSFET device that will be used for active device regions.

Figure 2:
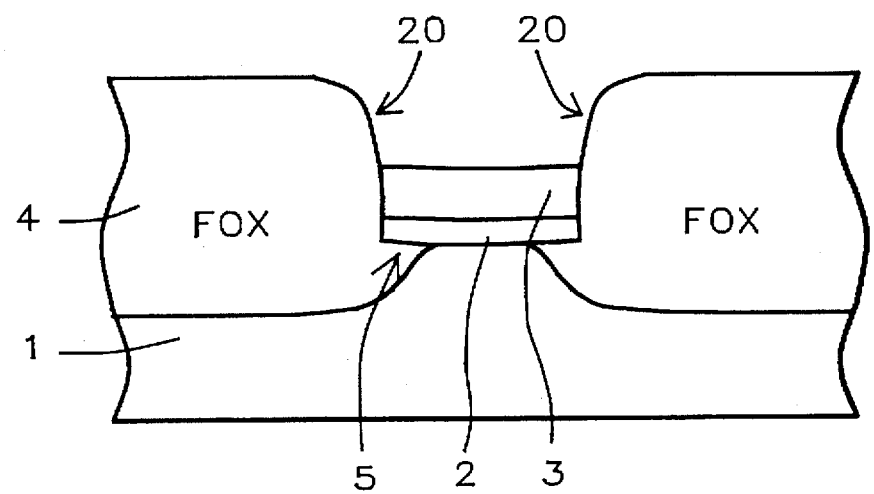
Figure 3:
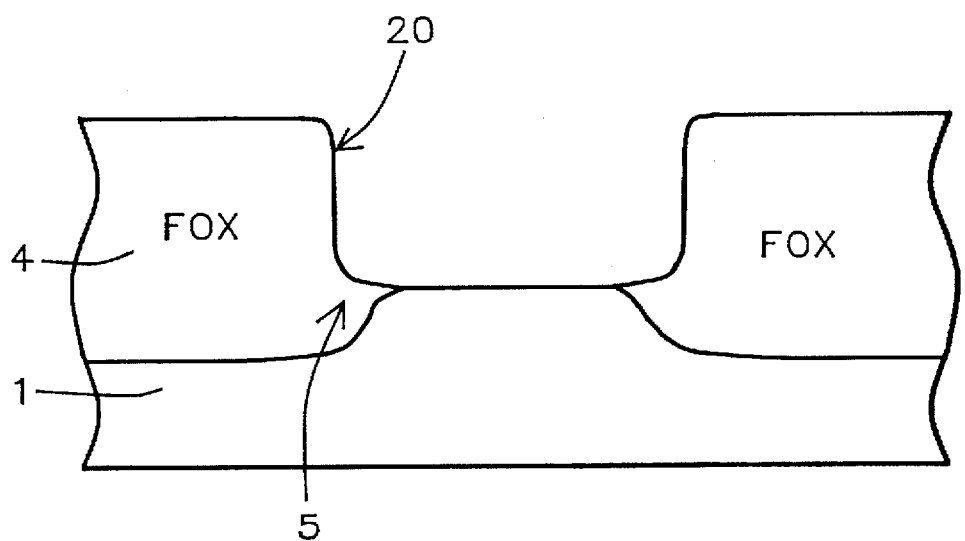

FIG. 2, shows the formation of FOX region, 4, via thermal oxidation in an oxygen - steam ambient, at a temperature between about 900° to 1050° C., to arrive at a FOX thickness between about 3000 to 6000 Angstroms. The growth of FOX region, 4, transpires via oxidation of semiconductor substrate, 1, therefore approximately half of FOX region, 4, is above the surface of semiconductor substrate, 4, while the remaining FOX region, 4, resides below the surface of semiconductor substrate, 1. In addition the top half of FOX region, 4, in the area adjacent to the oxidation resistant, composite mask, has a steep slope, 20, between about 45° to 75° C. This steep slope can lead to difficulties when attempting to create a polysilicon gate structure, via RIE of a polysilicon layer, creating unwanted polysilicon sidewalls, or residuals. Referring to the bottom half of FOX region, 4, birds beak, 5, formation occurs under the oxidation resistant, composite mask. The birds beak, 5, or protruding oxide, is influenced by oxidation, and the oxidation resistant, composite mask, thicknesses. In this case birds beak region, 5, protruded between about 0.05 to 0.20 µM, under the oxidation resistant, composite mask. The birds beak formation can also lead to subsequent MOSFET fabrication problems. FIG. 3, schematically shows the structure after removal of the oxidation resistant, composite mask, via hot phosphoric acid, for silicon nitride layer, 3, and a buffered hydrofluoric acid solution, for silicon oxide layer, 2. The topography of the FOX region, 4, shown in FIG. 3, however is still severe due to the steep slope, 20, and the birds beak region, 5.

Figure 4:
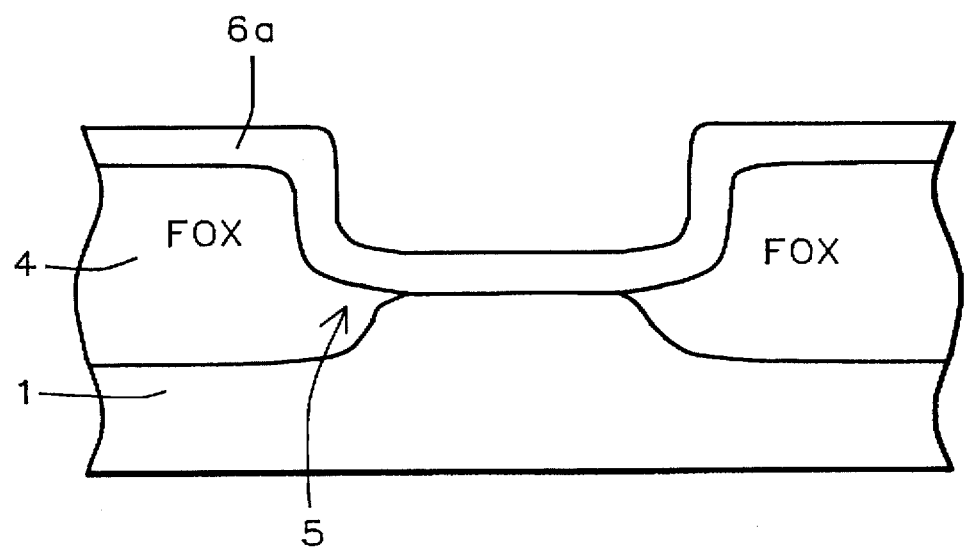
FIGS. 4-5, which schematically, in cross-sectional style, show the fabrication stages used to create the FOX insulator spacers.
Figure 5:
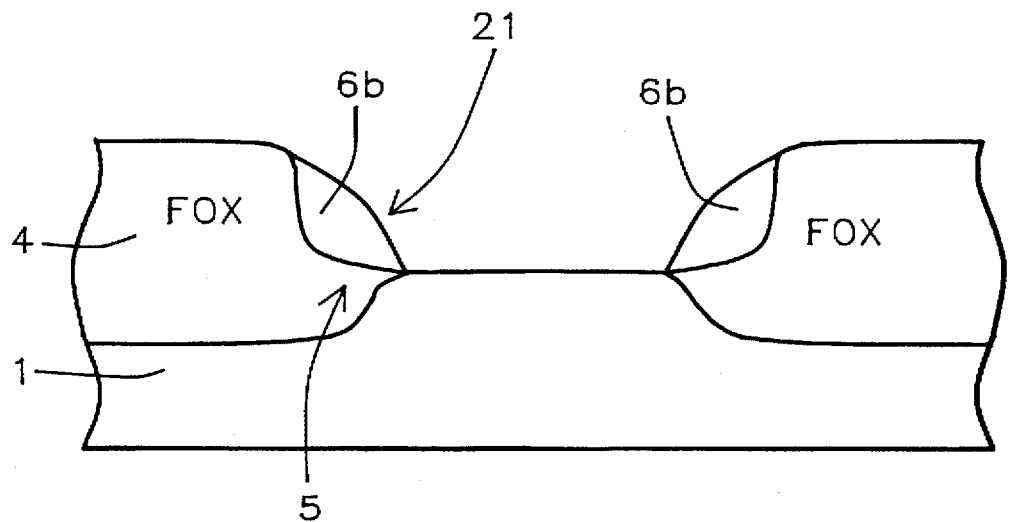

FIGS. 4–5, will schematically describe the process used to decrease the severity of topography of FOX region, 4. First an insulator layer of silicon oxide, 6a, is deposited via either LPCVD or plasma enhanced chemical vapor deposition, (PECVD), procedures, at a temperature between about 650° to 750° C., to a thickness between about 600 to 2000 Angstroms, using tetraethylorthosilicate, (TEOS), or silane gas as a source. Another option is to use a silicon nitride layer, again deposited via either LPCVD or PECVD procedures, at a temperature between about 600° to 800° C., to a thickness between about 600 to 2000 Angstroms. This is shown schematically in FIG. 4. Next a selective, anisotropic, RIE procedure, using $CHF_3$ as an etchant, is employed to create silicon oxide spacer, 6b, on the sides of FOX region, 4. The selective RIE ambient, using laser endpoint detection, is terminated at the point in which silicon supplied by semiconductor substrate, 1, is observed. The steep slope, 20, of FOX region, 4, is now replaced with milder slope, 21, between about 30° to 50° C., for silicon oxide spacer, 6b. In addition the birds beak region, 5, is now also covered by silicon oxide spacer, 6b. This is shown schematically in FIG. 5.

Figure 6:
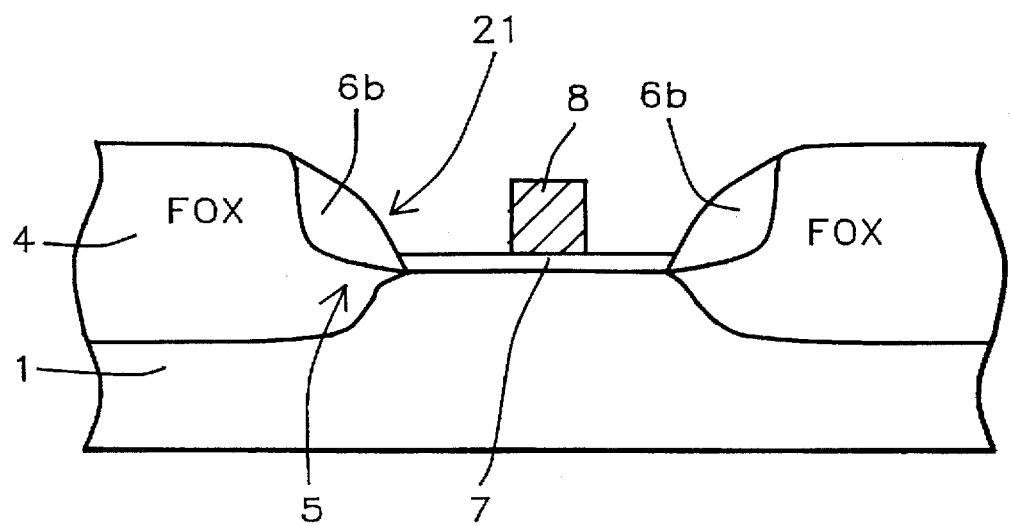
FIGS. 6-8, which schematically, in cross-sectional style, show the stages of fabrication used to complete a MOSFET device structure, having FOX insulator spacers.
Figure 7:
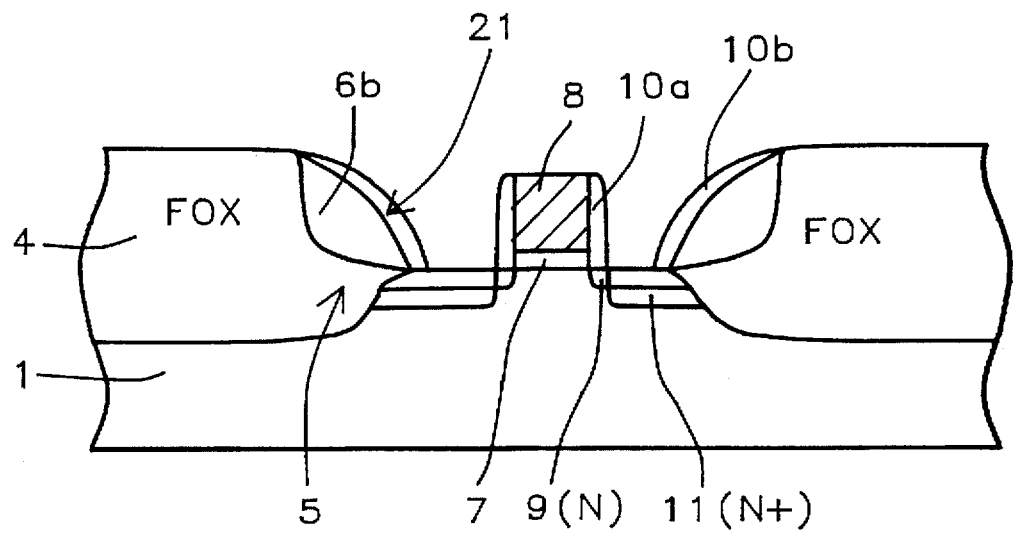
Figure 8:
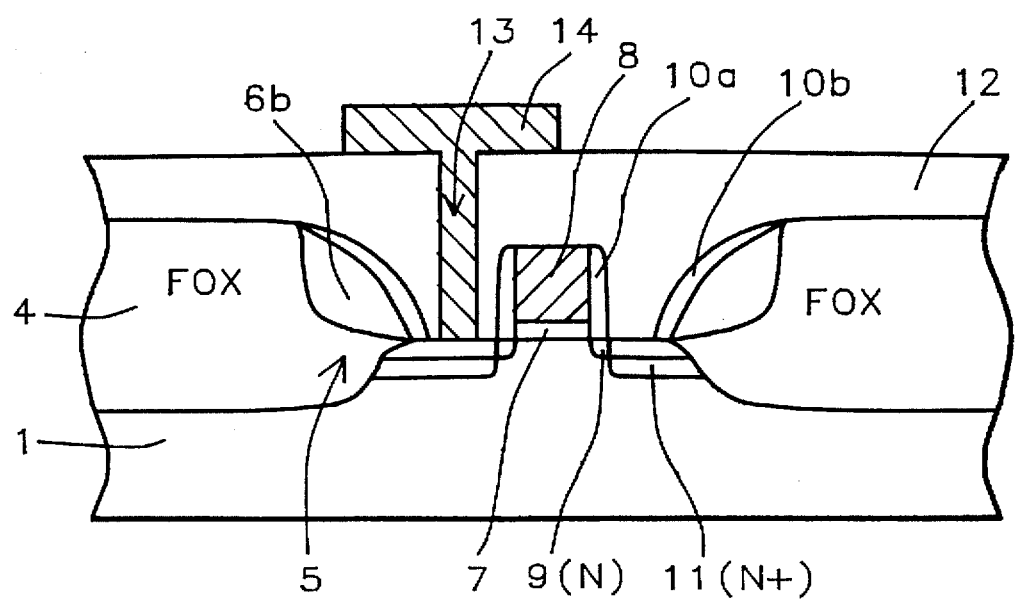

FIGS. 6–8, show the significant remaining fabrication stages, used to create a MOSFET device structure, incorporating insulator spacers on the FOX regions. After careful wet cleans, including the use a buffered hydrofluoric acid solution, a gate insulator layer, 7, of silicon dioxide, is thermally grown in an oxygen - steam ambient, at a temperature between about 850° to 1000° C., to a thickness between about 50 to 200 Angstroms. Next a polysilicon layer is deposited via LPCVD procedures, at a temperature between about 525° to 575° C., to a thickness between about 2000 to 3500 Angstroms. The polysilicon layer can be deposited intrinsically and doped via ion implantation of either arsenic or phosphorous, or the polysilicon layer can be deposited using insitu doping procedures by adding either arsine or phosphine to a silane ambient. Conventional photolithographic and RIE procedures, using $Cl_2$ as an etchant for the polysilicon layer, are used to create polysilicon gate structure, 8, schematically shown in FIG. 6. The milder slope of silicon oxide spacer, 6b, allows the patterning of the polysilicon layer to occur successfully, without possible sidewall formation that may have occurred if a polysilicon layer, overlying the steeper slope, 20, of FOX region, 4, would have been present. In addition the milder slope, 6b, allows easier removal of residual polysilicon to be performed. Photoresist removal is accomplished via plasma oxygen ashing and careful wet cleans.

A lightly doped source and drain region, 9, is next created via ion implantation of phosphorous, at an energy between about 20 to 40 KeV, at a dose between about 1E11 to 1E13 atoms/$cm^2$. Another layer of silicon oxide is then deposited, again via either LPCVD or PECVD procedures, at a temperature between about 650° to 750° C., to a thickness between about 1000 to 3000 Angstroms, using TEOS as a source. A selective, anisotropic RIE procedure, using $CHF_3$ as an etchant, is used to form insulator spacers, 10a, on the sides of polysilicon gate structure, 8. A thinner insulator spacer, 10b, is also formed on insulator spacers, 6b, thinner than the insulator spacer, 10a, formed on polysilicon gate structure, 8, due to the milder slope, 21, of insulator spacers, 6b, compared to the straight walls of polysilicon gate structure, 8. A heavily doped source and drain region, 11, is arrived at via ion implantation of arsenic, at an energy between about 30 to 80 KeV, at a dose between about 1E15 to 5E16 atoms/$cm^2$. The result of these processes are shown schematically in FIG. 7.

Metal contacts to the MOSFET device structure, are next addressed,and schematically shown in FIG. 8. A layer of silicon oxide, 12, is deposited, again via use of either LPCVD or PECVD procedures, at a temperature between about 600° to 800° C., to a thickness between about 3000 to 8000 Angstroms. Photolithographic and RIE procedures, using $CHF_3$ as an etchant, are used to open contact hole, 13, in silicon oxide layer, 12, to heavily doped source and drain region, 11. After removal of photoresist, via plasma oxygen ashing and careful wet cleans, a layer of aluminum, containing between about 1 to 3% copper, and between about 0.5 to 1% silicon, is deposited to a thickness between about 5000 to 8000 Angstroms, using r.f. sputtering procedures. Photolithographic and RIE processing, using $Cl_2$ as an etchant for the aluminum based layer, is again performed, creating metal contact structure, 14, schematically shown in FIG. 8. Photoresist is again removed via plasma oxygen ashing and careful wet cleans.

This process, implemented to improve the topography of FOX regions, via the formation of insulator spacers on the steep sides of FOX regions, although shown for an N channel, MOSFET device, can also be applied to P channel MOSFET devices, to complimentary, (CMOS), devices, as well as to bipolar-CMOS, BiCMOS), devices.

While this invention has been particularly shown and described with reference to the preferred embodiments thereof, it will be understood by those skilled in the art that various changes in form and details may be made without departing from the spirit and scope of this invention.

What is claimed is:

1. A method of fabricating a MOSFET device, on a semiconductor substrate, with insulator spacers on the sides of field oxide regions, comprising the steps of:

forming an oxidation resistant, composite mask, on regions of said semiconductor substrate;

forming field oxide regions in said semiconductor substrate, in areas not covered by said oxidation resistant, composite mask;

removal of said oxidation resistant, composite mask, exposing a region of said semiconductor substrate to be used for MOSFET active device region;

depositing a first insulator layer on said field oxide regions, and on said MOSFET active device region;

anisotropic, dry etching of said first insulator layer, to create first insulator spacers on the sides of said field oxide regions;

growing a gate insulator layer on said MOSFET active device region;

depositing a polysilicon layer on said gate insulator layer, on said field oxide regions, and on said first insulator spacers;

patterning of said polysilicon layer to create a polysilicon gate structure, on said gate insulator layer;

ion implanting a first conductivity imparting dopant into an area of said MOSFET active device region, not covered by said polysilicon gate structure, not covered by said field oxide regions, and not covered by said first insulator spacers, to form a lightly doped source and drain region;

depositing a second insulator layer on said lightly doped source and drain regions, on said polysilicon gate structure, on said field oxide regions, and on said first insulator spacers;

anisotropic, dry etching of said second insulator layer, to create a second insulator spacer on the sides of said polysilicon gate structure;

ion implanting a second conductivity imparting dopant into an area of said MOSFET active device region, not covered by said polysilicon gate structure, not covered by said second insulator spacers, not covered by said field oxide regions, and not covered by said first insulator spacers, to form a heavily doped source and drain region; and forming metal contacts to said heavily doped source and drain regions, and to said polysilicon gate structure.

2. The method of claim 1, wherein said oxidation resistant, composite mask is comprised of an overlying layer of silicon nitride, deposited via LPCVD procedures, at a temperature between about 600° to 800° C., to a thickness between about 500 to 1500 Angstroms, and an underlying silicon dioxide layer, obtained via thermal oxidation, at a temperature between about 850° to 1000° C., to a thickness between about 100 to 500 Angstroms.

3. The method of claim 1, wherein said field oxide region is thermally grown in an oxygen steam ambient, at a temperature between about 900° to 1050° C., to a thickness between about 3000 to 6000 Angstroms.

4. The method of claim 1, wherein said oxidation resistant, composite mask is removed using a hot phosphoric acid solution for the silicon nitride layer, and a buffered hydrofluoric acid solution for the silicon oxide layer.

5. The method of claim 1, wherein the slope of said field oxide region, from the top of said field oxide region to the surface of said MOSFET active device region is between about 45° to 75° C.

6. The method of claim 1, wherein said first insulator layer is silicon oxide, deposited using LPCVD procedures, at a temperature between about 650° to 750° C., to a thickness between about 600 to 2000 Angstroms, using tetraethylorthosilicate, or silane gas as a source.

7. The method of claim 1, wherein said first insulator layer is silicon oxide, deposited using PECVD procedures, at a temperature between about 650° to 750° C., to a thickness between about 600 to 2000 Angstroms, using tetraethylorthosilicate, or silane gas as a source.

8. The method of claim 1, wherein said first insulator layer is silicon nitride, deposited using LPCVD procedures at a temperature between about 600° to 800° C., to a thickness between about 600 to 2000 Angstroms.

9. The method of claim 1, wherein said first insulator spacer is formed via anisotropic, RIE procedures, using $CHF_3$ as an etchant, with a slope, from the top of said first insulator spacer, to the surface of said MOSFET active device region of between about 30° to 50° C.

10. The method of claim 1, wherein said polysilicon layer is deposited using LPCVD procedures, at a temperature between about 525° to 575° C., to a thickness between about 2000 to 3500 Angstroms.

11. The method of claim 1, wherein said polysilicon gate structure is formed via anisotropic RIE procedures, using $Cl_2$ as an etchant.

12. A method for forming a field oxide region, on a semiconductor substrate, with insulator spacers on the sides of said field oxide regions, comprising the steps of:

growing a first layer of silicon oxide on said semiconductor substrate;

depositing a first layer of silicon nitride on said first layer of silicon oxide;

patterning of said second silicon nitride layer, and of said first silicon oxide layer, to create an oxidation resistant, composite mask, overlying an area of said semiconductor substrate to be used for MOSFET active device region;

forming field oxide regions, in an area of said semiconductor substrate, not covered by said oxidation resistant, composite mask;

removal of said oxidation resistant, composite mask, exposing said MOSFET active device regions, in an area of said semiconductor substrate not covered by said field oxide regions;

depositing an insulator layer on said field oxide regions, and on said MOSFET active device region; and anisotropic dry etching of said insulator layer, to create an insulator spacer, on the sides of said field oxide region.

13. The method of claim 12, wherein said first silicon—oxide layer is grown via thermal oxidation, in an oxygen steam ambient, at a temperature between about 850° to 1000° C., to a thickness between about 100 to 500 Angstroms.

14. The method of claim 12, wherein said first silicon nitride layer is grown using LPCVD procedures, at a temperature between about 600° to 800° C., to a thickness between about 500 to 1500 Angstroms.

15. The method of claim 12, wherein said oxidation resistant, composite mask is patterned via RIE procedures, using $Cl_2$ as an etchant for said first silicon nitride layer, and $CHF_3$ as an etchant for said first silicon oxide layer.

16. The method of claim 12, wherein said field oxide region is thermally grown in an oxygen—steam ambient, at a temperature between about 900° to 1050° C., to a thickness between about 3000 to 6000 Angstroms.

17. The method of claim 12, wherein said oxidation resistant, composite mask is removed using a hot phosphoric acid solution for said first silicon nitride layer, and a buffered hydrofluoric acid solution for said first silicon oxide layer.

18. The method of claim 12, wherein the slope of said field oxide region, from the top surface of said field oxide region to the surface of said MOSFET active device region, is between about 45° to 75° C.

19. The method of claim 12, wherein said insulator layer, used for said insulator spacer, is silicon oxide, deposited using LPCVD procedures, at a temperature between about 650° to 750° C., to a thickness between about 600 to 2000 Angstroms, using tetraethylorthosilicate, or silane gas as a source.

20. The method of claim 12, wherein said insulator layer, used for said insulator spacer, is silicon oxide, deposited using PECVD procedures, at a temperature between about 650° to 750° C., to a thickness between about 600 to 2000 Angstroms, using tetraethylorthosilicate, or silane gas as a source.

21. The method of claim 12, wherein said insulator layer, used for said insulator spacer, is silicon nitride, deposited using LPCVD procedures, at a temperature between about 600° to 800° C., to a thickness between about 600 to 2000 Angstroms.

22. The method of claim 12, wherein said insulator spacer is formed via anisotropic RIE procedures, using $CHF_3$ as an etchant, with said insulator spacer having a slope between about 30° to 50° C., from the top of said insulator spacer to the surface of said MOSFET active device region.

* * * * *